United States Patent
Vaidyanathan et al.

(10) Patent No.: US 7,360,309 B2
(45) Date of Patent: Apr. 22, 2008

(54) METHOD OF MANUFACTURING MICROCHANNEL HEAT EXCHANGERS

(75) Inventors: K. Ranji Vaidyanathan, Tucson, AZ (US); Alfonso Ortega, Tucson, AZ (US); Marlene Platero, Tucson, AZ (US); Prathib Skandakumaran, Scottsdale, AZ (US); Chad Bower, Tucson, AZ (US)

(73) Assignee: Advanced Ceramics Research, Inc., Tucson, AZ (US)

( * ) Notice: Subject to any disclaimer, the term of this patent is extended or adjusted under 35 U.S.C. 154(b) by 15 days.

(21) Appl. No.: 10/767,483

(22) Filed: Jan. 28, 2004

(65) Prior Publication Data

US 2005/0039885 A1  Feb. 24, 2005

Related U.S. Application Data

(60) Provisional application No. 60/443,439, filed on Jan. 28, 2003.

(51) Int. Cl.
  *B23P 15/26* (2006.01)
  *B28B 1/30* (2006.01)
  *B22F 3/11* (2006.01)

(52) U.S. Cl. .............. 29/890.035; 29/890.03; 264/635; 264/629; 264/630; 419/2; 419/38

(58) Field of Classification Search .......... 29/890.03, 29/890.035; 264/605, 610, 640, 669, 460, 264/656; 419/2, 10, 37, 38; 165/905, 80.1–80.5; 361/689, 690, 699; 257/722; 372/34, 35
See application file for complete search history.

(56) References Cited

U.S. PATENT DOCUMENTS

| 3,222,144 | A | * | 12/1965 | Davenport | ........... 428/593 |
|---|---|---|---|---|---|
| 4,746,479 | A | * | 5/1988 | Hanaki et al. | ........... 264/629 |
| 4,814,029 | A | * | 3/1989 | Butcher | ........... 156/89.22 |
| 5,317,805 | A | * | 6/1994 | Hoopman et al. | ........... 29/890.03 |
| 5,533,258 | A | * | 7/1996 | Rainer et al. | ........... 29/890.03 |

(Continued)

OTHER PUBLICATIONS

C. Bower, A. Ortega, P. Skandakumaran, R. Vaidyanathan and T. Phillips, "Heat Transfer in Water-Cooled Silicon Carbide Millchannel Heat Sinks for High Power Electronic Applications", Proceedings of IMECE 2003, Washington, DC.

(Continued)

*Primary Examiner*—David P. Bryant
*Assistant Examiner*—Sarang Afzali
(74) *Attorney, Agent, or Firm*—Banner & Witcoff, Ltd.

(57) ABSTRACT

A heat exchanger device includes an extruded body that includes one or more layers of channels for coolant flow therethrough, the channels generally having inner diameters of between about 50 microns to about 2000 microns. The device is formed of a material having a high thermal conductivity to facilitate transfer of heat from the heating components present in the subject cooling application to the coolant passing through the heat exchanger and to be compatible with materials of the heating components. The device material is selected from the group consisting of ceramic oxides, ceramic carbides, ceramic nitrides, ceramic borides, ceramic silicides, metals, and intermetallics, and combinations thereof. The heat exchanger device is formed from an extruded filament that is arranged to give the desired channel configuration. The filament includes a central, removable material and an outer material that forms the channel walls upon removal of the central material.

25 Claims, 6 Drawing Sheets

U.S. PATENT DOCUMENTS

| | | | | |
|---|---|---|---|---|
| 6,093,961 | A * | 7/2000 | McCullough | 257/718 |
| 6,465,561 | B1 * | 10/2002 | Yarbrough et al. | 524/496 |
| 6,919,504 | B2 * | 7/2005 | McCutcheon et al. | 174/16.3 |
| 6,939,505 | B2 * | 9/2005 | Musso et al. | 264/635 |
| 2002/0037142 | A1 * | 3/2002 | Rossi | 385/92 |
| 2003/0131476 | A1 * | 7/2003 | Ocher et al. | 29/890.03 |
| 2003/0173720 | A1 * | 9/2003 | Musso et al. | 264/635 |
| 2004/0106713 | A1 * | 6/2004 | Avakian | 524/404 |
| 2005/0205241 | A1 * | 9/2005 | Goodson et al. | 165/80.4 |

OTHER PUBLICATIONS

F. Incropera, and D. Dewitt, "Fundamentals of Heat and Mass Transfer" 5$^{th}$ ed., New York, Wiley, 2002, pp. 482-490.

R.J. Pieper and A.D. Kraus, "Performance Analysis of Double Stack Cold Plates Covering All Conditions of Assymetric Heat Loading", ASME Journal of Electronic Packaging. vol. 20: 296-301, 1998.

R.J. Pieper and S. Michael, , "Circuit Modeling to Predict the Performance of Force-Cooled Cold Plate Structures", Proceedings—IEEE International Symposium on Circuits and Systems, v 6, 1999, p. VI-105-VI-108.

R.J. Phillips, 1990, "Micro-Channel Heat Sinks, in A. Bar-Cohen A.D. Kraus (Eds.)" Advances in Thermal Modeling of Electronic Components and Systems vol. 2, ASME New York Chapter 3. 1990.

C.B. Sobhan and S.V. Garimella, "A Comparative Analysis of Studies and Heat Transfer and Fluid Flow in Micro-Channels", Microscale Thermophys. Eng. vol. 15, pp. 293-311, 2001.

D.B. Tuckerman and R.F.W. Pease, 1981, "High-Performance Heat Sinking for VLSI", IEEE Electron Dev. Lett. 2, pp. 126-129, May 1981.

K. Vafai and L. Zhu, 1999, "Analysis of two-layered micro-channel heat sink concept in electronic cooling", International Journal of Heat and Mass Transfer, 42, pp. 2287-2297.

R. Vaidyanathan, J. Walish, J.L. Lombardi, S. Kasichainula, P. Calvert, K.C Cooper, "The Extrusion Free Forming of Funtional Ceramic Prototypes", Journal of Metals, 52 (12), pp. 34-37 (2000).

X.J. Wei and Y. Joshi, "Stacked Microchannel Heat Sinks for Liquid Cooling of Microelectronic Components", Proceedings of ASME IMECE 2000, Florida.

\* cited by examiner

FIG. 1
(30 X)
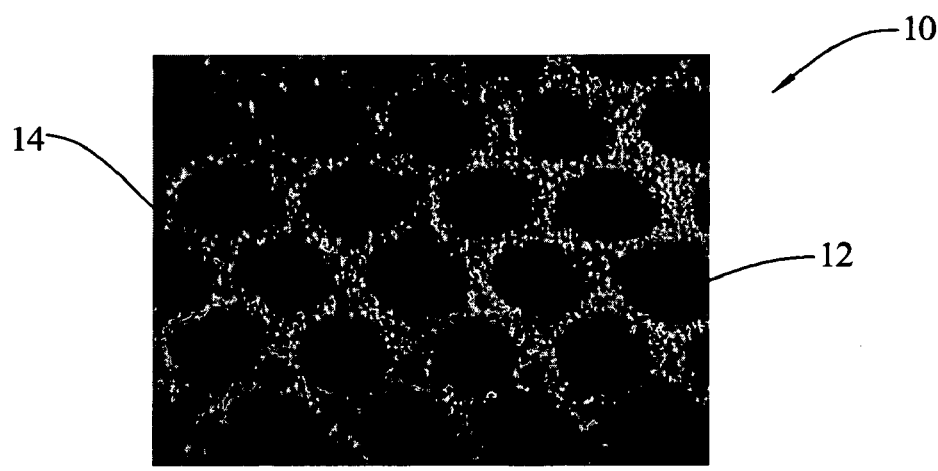
BEST AVAILABLE COPY
FIG. 2
FIG. 3
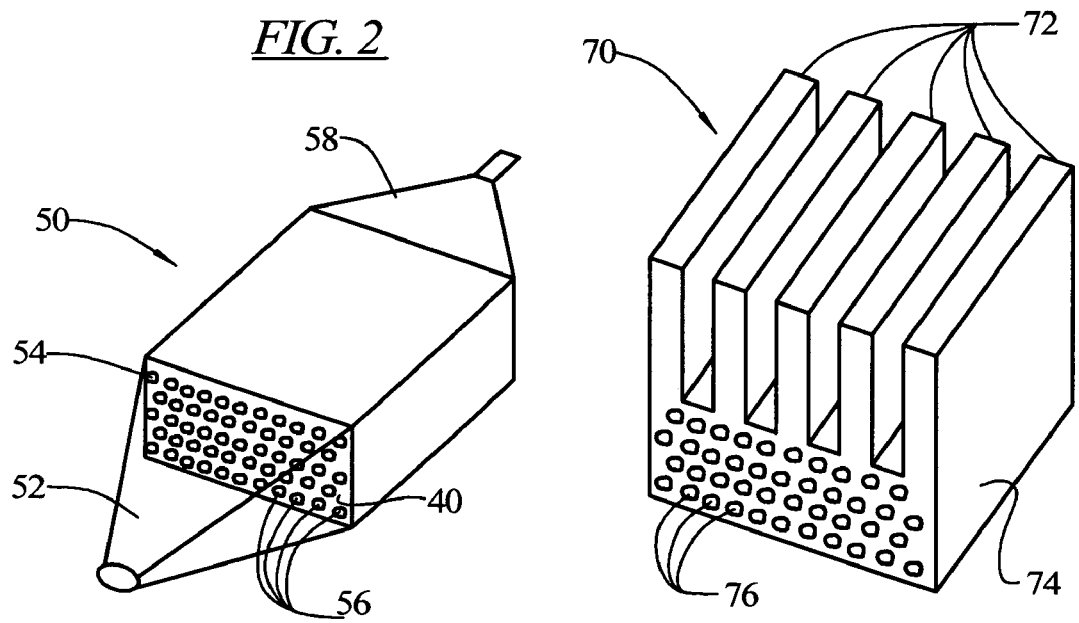

mcp (W/C)

mcp (W/C)

Optimization of number of layers with fixed overall flow rate with single-sided heating
R1 is the overall thermal resistance for one layer case
P1 is the overall pumping power for one layer case

THERMAL RESISTANCE VS MASS FLOW RATE

HEAT TRANSFER COEFFICIENT (BASE AREA) VS MASS FLOW RATE

HEAT TRANSFER COEFFICIENT (BASE AREA) VS MASS FLOW RATE

METHOD OF MANUFACTURING MICROCHANNEL HEAT EXCHANGERS

CROSS-REFERENCE TO RELATED APPLICATION

This application is based on, and claims the benefit of co-pending U.S. Provisional Application Ser. No. 60/443,439, filed on Jan. 28, 2003, the disclosure of which is incorporated herein by reference.

STATEMENT REGARDING FEDERALLY SPONSORED RESEARCH OR DEVELOPMENT

This invention was made with U.S. Government support under grants DASG60-02-P-0280 awarded by the U.S. Army and N00014-03-M-0295 awarded by the U.S. Navy. Accordingly, the Government may have certain rights in the invention described herein.

BACKGROUND OF THE INVENTION

The present invention relates to heat exchanger systems for use generally with electronic applications. More particularly, the present invention relates to heat exchanger bodies having oriented micro-scale channels and methods of fabricating such bodies.

Rapid advances in large-scale integrated electronics packaging, lightweight composite structures, and high conductivity materials are enabling the development of new manufacturing and integration technology called multifunctional structures ("MFS"). The main MFS concept is to embed electronics assemblies (e.g., multi-chip modules, or "MCM"), integral thermal management, miniature sensors, and actuators into load carrying structures along with associated embedded cabling for power and data transmission. This integration yields major weight, volume and cost savings. While MCMs offer considerable reduction in both the microelectric packaging volume and interconnection signal delay, the integration results in higher heat fluxes. Thus, thermal management of microelectronic devices is required to provide suitable heat dissipation for proper operation and acceptable reliability. The methods of connecting the signals and power from the MCM to the next level package (e.g., printed wiring board or 3-D MCM stack) presents heat removal challenges.

Improved cooling techniques are required for reliable electronics given current trends toward increased packaging densities and higher power levels, especially in fields like aircraft avionics, electric power systems, radar and weapons systems. Further confounding thermal management of aircraft electronics is a limited availability of compatible heat sink coolants at suitable temperatures. Very high heat fluxes (500 to 2000 W/cm$^2$) must be cooled in Directed Energy Weapon ("DEW") systems, including High Energy Laser ("HEL") diodes and High Power Microwave ("HPM") Gyrotrons and Klystrinos. Closed and open look (expendable) cooling systems are being developed to handle transient heat loads as large as 1 MW. Cost, reliability, weight, and volume are key factors in designing cooling systems for both power conversion and weapons systems. The required flow rates and temperature level of the coolant are both significant. Therefore, compact cooling approaches that are capable of handling the high heat fluxes at a low thermal resistance are needed. Compact cooling systems are also needed in cellular and radio communications equipment, air traffic control and monitoring systems, and high-powered amplifiers.

One type of cooling system incorporates a microchannel heat sink. The heat sink can be made from a thermally conductive solid, typically copper or silicon, with a single layer of small channels fabricated into the surface of a structure. The channels are fabricated by precision machining or chemical etching. Thus, the machining or etching capabilities will limit the size, number and configuration of the channels that can be fabricated on the surface of the structure. The need for secondary bonding processes to fabricate a heat sink also presents challenges.

Another method of compact cooling involves an integrated die substrate and cooler concept to provide high-performance heat sinking for high power dissipation devices. The cooler is a bonded stack of identical laminations, with every other lamination in the stack flipped to provide an axis-symmetric mating lamination. The pattern is designed to that the rounded slot-ends of a flipped lamination overlap the slot-ends of the un-flipped lamination. Essentially, a circular portal is created connecting slots of adjacent layers in the stack. While this concept is efficient, it is a very complicated structure to fabricate and therefore expensive.

Therefore, there remains a need for compact heat exchanger systems for electronic and other applications that can be manufactured in an efficient and cost-effective manner.

BRIEF SUMMARY OF THE INVENTION

The present structures and methods of fabricating the structures overcome the difficulties previously encountered with cooling systems for small-scale applications. Heat exchanger devices are formed of materials having high thermal conductivities to facilitate transfer of heat from the heating components to the coolant passing through the heat exchanger. Additionally, the heat exchanger materials are selected to be compatible with materials of the heating components. Suitable materials for the heat exchanger device include ceramic oxides, ceramic carbides, ceramic nitrides, ceramic borides, ceramic silicides, metals, and intermetallics, and the like, and combinations thereof. In a preferred embodiment, a heat exchanger device is formed of silicon carbide and is suitable for use with electronic components.

The heat exchanger devices include one or more layers of microchannels through which the coolant passes. The microchannels are generally uniform in size and shape. The channels can be arranged to provide co-linear, multi-directional, looped or other desired flow pattern. The heat exchanger device also can include external cooling elements, such as fins.

Methods of fabricating the heat exchanger devices include preparing and extruding a two-component filament that generally includes an inner core material surrounded by an outer shell material. One or more extruded filaments are manually or mechanically, such as by a rapid prototyping process, arranged in the desired orientations. The resulting green body is finished using various methods to provide a finished micro-channel heat exchanger device. Prior to or during finishing processes, the core material is removed from the green body, leaving the shell materials, which form the walls of the microchannels. Fabrication of the heat exchanger devices from a solid filament, the core of which is ultimately removed, allows formation of a plurality of internal, generally uniform microchannels.

An analytical model can be utilized to characterize and optimize the thermal and hydrodynamic performance of a heat exchanger. The model allows an optimum number of layers to be identified to maximize thermal performance for given channel dimension and pumping power.

BRIEF DESCRIPTION OF THE DRAWINGS

FIG. 1 is a photomicrograph of a cross-section of a green body for fabricating a heat exchanger device in accordance with the present invention;

FIG. 2 is a perspective view of a heat exchanger system, with a portion of a side wall cut away to show the internal finished green body, in accordance with the present invention;

FIG. 3 is a perspective view of a second heat exchanger system, with a portion of a side wall cut away to show the internal finished green body, having external cooling elements in accordance with the present invention;

DETAILED DESCRIPTION OF THE INVENTION

Figure 4:
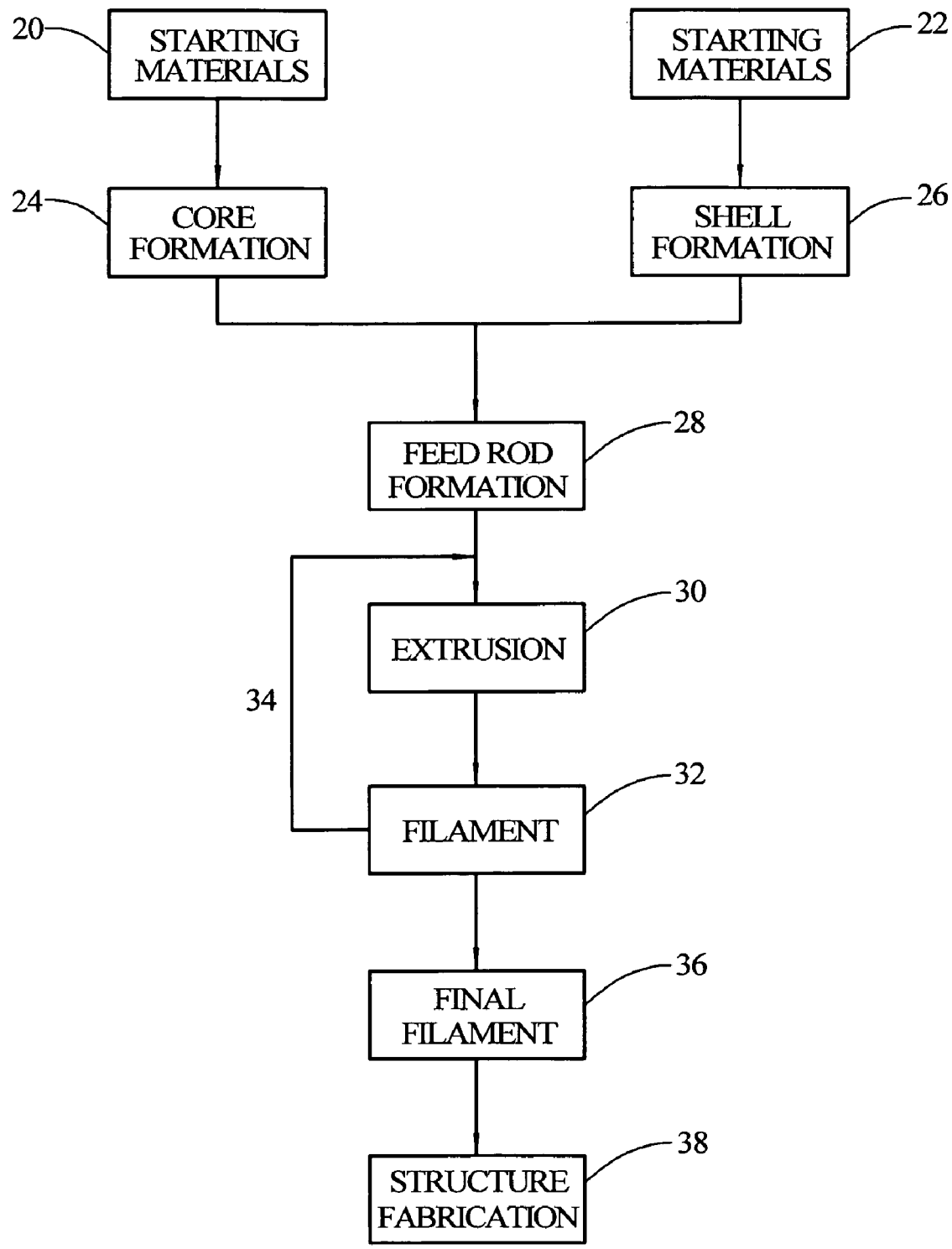
FIG. 4 is a schematic flow diagram showing a process of preparing filaments in accordance with the present invention.

The present invention relates to heat exchanger systems suitable for use in small-scale applications, such as high power electronic applications, and to methods of fabricating such heat exchanger systems. More particularly, the present invention provides heat exchanger systems having a plurality of micro-scale channels configured to accommodate the flow of air or cooling fluid in both passive and actively pumped cooling systems. Processes are provided that allow for fabrication of three-dimensional heat exchanger devices, including those having complex geometries.

The heat exchanger systems of the present invention are suitable for use in power electronic applications including radar, space, high-speed missiles and other weapons systems. The heat exchangers are installed in the desired application to provide cooling of the electronic circuitry and substrate materials. In many electronic applications, thermal dissipation levels of 1000 Watts/cm$^2$ or more are required. Additionally, there often is a temperature ceiling, such as about 100° C. for the application at the junction level ($T_{junction}$) that must not be exceeded. The heat exchanger systems include integrated structures that can be attached directly to printed circuit boards and other electronic components.

The heat exchanger system provides a cold plate/heat sink device that is suitable for use in high and ultra-high heat flux electronics cooling. The heat sink is made from a high thermal conductivity solid with any number of flow channels. An electronic component is then mounted on the surface of the heat sink. The heat generated by the component is first transferred to the channels by heat conduction through the solid and then removed by the cooling fluid which is forced to flow through the channels. The heat sink combines the attributes of high surface area per unit volume, large heat transfer coefficient, and small cooling fluid inventory. These microstructures provide a large area of contact between the solid and the fluid as well as a large temperature gradient within the fluid near the channel wall due to the extremely small channel width.

Generally, the heat exchanger system includes one or more layers of channels in a desired configuration and orientation. In operation, a coolant, such as air or a liquid such as water or refrigerant, is passed through the channels. The channels preferably are of a size and scale that are optimized for the size of the components of the application in which the heat exchanger is included, as well as the flow of liquid coolant. Typically, the inner diameters of the channels range between about 50 to about 75 microns up to about 1500 to about 2000 microns, although larger and smaller channels also can be used. Preferably, the diameter of the channels is between about 50 to about 100 microns.

The heat exchanger systems are suitable for use with either single-phase (e.g., liquid) flow or two-phase (e.g., phase change) flow as known to one of skill in the art. In applications where thermal management requirements are greater, two-phase flow may be desired. A large temperature gradient can produce destructive thermal stresses, for example, in electronic components and adversely affect electronic performance. Two-phase flow limits the temperature variation as it relies upon latent heat exchange to maintain stream-wise temperature uniformity within the substrate base. Boiling two-phase flow is capable of dissipating very high heat fluxes at constant flow rates while maintaining a relatively constant temperature. Two-phase micro-channel cooling permits partial or total consumption of liquid by evaporation, thus requiring minimal coolant flow rates. The processes of liquid micro-pumping action, transient heat diffusion into the liquid and, and the ensuing latent heat exchange facilitate the superior thermal management associated with the phase cooling techniques. A significant advantage of phase change flow is that a large increase in heat flux results in only a minimal increase in application temperature.

Referring to FIG. 1, there is shown a cross-section of a composite body 10 that can be further processed to fabricate a heat exchanger device in accordance with the invention. The composite body 10 comprises one or more extruded filaments. Each filament includes a first material 12, or core, generally located along the axis of the filament. A second material 14, or shell, is generally annular shaped and surrounds the core. The filaments are arranged side-by-side to form a layer, and two or more layers can be combined to form a multi-layer composite body 10.

The layers of filaments can be arranged so that the resulting channels of different layers all extend in the same direction for co-linear, or unidirectional, flow. Multi-directional flow also is possible. In one embodiment, alternate layers can be rotated 90° to provide cross flow through the composite bodies. The composite body 10 shown in FIG. 1 is generally rectilinear in shape with linearly extending channels. In other embodiments, the channels can be looped or otherwise curved. For example, the channels may be curved to correspond with a curved surface of the heating component adjacent to which the heat exchanger device is positioned. This is sometimes referred to as conformal flow. As another example, each of the channels can form a continuous loop for concentric flow. Thus, numerous channel configurations and flow patterns through the channels are possible.

The two-component filaments are extruded and arranged in an unfinished, or "green," state into the desired geometries and then subjected to conditions effective for providing a finished heat exchanger body. The filaments can be arranged in one or more layers to provide essentially a three-dimensional array of filaments of predetermined orientation and size. During finishing processes, the core material is removed from the composite body, leaving the shell material, which forms the walls of the channels of the heat exchanger device. A multi-layer heat exchanger device thus can be formed without the need to individually laminate the separate layers that comprise the device.

Referring to FIG. 2, a finished composite body 40 is encased within the walls of the heat exchanger device 50. A manifold connection 52 at one wall 54 of the heat exchanger device 50 allows the device to be connected to a fluid source and pumping system. The fluid enters the device 50 through the opening 52 and passes through the internal channels 56. An exit manifold 58 is positioned on the wall opposite the entrance opening 52 to allow the fluid to pass out of the heat exchanger device 50.

In other embodiments, the heat exchanger systems include external cooling elements. Generally, one or more shaped elements, such as fins, extend outwardly from one or more surfaces of the heat exchanger system. The shaped elements are spaced from one another to permit air flow between the elements. As a result, heat transfer from the shaped elements to the air is achieved. Preferably, the shaped elements are formed of the same material as the channel walls. In one aspect, the shaped elements are extruded and formed in a layer-wise manner along with the green composite body. As shown in FIG. 3, a heat exchanger system 70 with a plurality of channels 76 also includes a plurality of fins 72 extending from the body 74 of the device. The size and spacing of the fins are optimized to enhance air flow and heat exchanger system performance.

Structural materials for the channel walls preferably have high thermal conductivities to facilitate transfer of heat from the heating components present in the subject cooling application to the coolant passing through the heat exchanger. Additionally, the heat exchanger structural materials are selected to be compatible with materials of the heating components. For examples, it is preferred that the various materials have similar coefficients of thermal expansion ("CTE") to limit thermal stresses that may result in localized stresses or even application failure.

Compositions for forming the shell include mechanically activated and agglomerate-free powders. Powders that may be used in the shell composition to provide the green matrix filament include ceramic oxides, ceramic carbides, ceramic nitrides, ceramic borides, ceramic silicides, metals, and intermetallics, and the like, or combinations thereof. Preferably, the powder has a relatively higher thermal conductivity. Preferably, the powder also has a CTE that is compatible with the materials used in the intended application to limit thermal stresses that may result in solder joint or component failure. For example, typical packaging materials include silicon, aluminum nitride and gallium nitride, which have CTEs between about 4 to about 7 ppm/K. Typically, the powder also is chosen to be suitable for co-extrusion with the polymer binder and to provide an appropriate structure after thermal processing. When weight is a concern, a powder having a relatively lower density can be selected to provide a lightweight final heat exchanger system.

In one embodiment, the shell composition includes silicon carbide powder. Silicon carbide has a high thermal conductivity and a CTE that is well matched to commonly used materials, such as silicon, aluminum nitride, and gallium nitride, such as used as packaging materials in electronic applications. These materials have CTEs in the range of about 4-7 ppm/K. Any mismatch of CTEs between materials may produce thermal stresses that cause joint or component failure. Further, silicon carbide is a low-density material that yields a lightweight component.

Generally, to prepare the shell composition, one or more powders are mixed with a binder compound in an amount sufficient to form a flowable composition. The binder compound can be a polymer binder, including thermoplastic and thermoset binders. Thermoplastic polymer binders that can be used include, but are not limited to, PMMA (polymethyl methacrylate), EVA (ethyl vinyl acrylate) commercially available as ELVAX 470 from E.I. DuPont Co., EEA (polyethylene ethylacrylate), commercially available as DPDA-618NT from Union Carbide, PEOx (poly-2-ethyl-2-oxazoline), PEG (polyethylene glycol), polystyrene, derivatives and copolymers of such polymers, acryloid copolymer resin (B-67), commercially available from Rohm and Haas, Philadelphia, Pa., microcellulose, and the like, and combinations thereof. Thermoset polymer binders that can be used include, but are not limited to, BLO (butrylactone, which is commercially available from Aldrich Chemical Company in Milwaukee, Wis.), HODA (hexanedioldiacrylate, which is also commercially available from Aldrich Chemical Company in Milwaukee, Wis.), and the like and combinations thereof.

The shell composition also may include additional processing aids. When a thermoplastic binder system is used, a compatibilizer or surfactant may be added to achieve high solids loading, to disperse the powder more effectively, and to reduce the viscosity of the mixture. Various compatibilizers may be used including, polyethylene glycol, stearic acid, xylene, and butyl oleate, or other additives like Al 3 wax and the like and combinations thereof may be used. In the case of a thermoset binder system, a dispersant is typically added in order to achieve high solids loading and to reduce the viscosity of the mixture. It also acts as a compatiblizer for the various components and reduces the viscosity of the composition. Various dispersants may be used including, but not limited to, organophosphate esters such as MAPHOS™ 8135, which is commercially available from BASF Corporation in Folcroft, Pa., and phosphate esters, such as PS-2 and the like. Examples of plasticizers that can be included in the shell composition include heavy mineral oil (HMO), commercially available as Mineral Oil White, Heavy, Labguard®, and methoxy polyethyleneglycol having a molecular weight of about 550 (MPEG-550) commercially available from Union Carbide.

Sintering aids can also be added. For example, ceramics typically have very high melting points, and the sintering aid is typically chosen based on the melting point of the ceramic material. For example, when the composition includes SiC or $Si_3N_4$, sintering aids including, but not limited to, yttrium oxide ($Y_2O_3$), aluminum oxide ($Al_2O_3$), ceria oxide ($Ce_2O_3$), other rare earth oxides, and the like, or combinations thereof may be used. Further, when the composition includes WC, alumina and similar materials may be used as a sintering aid. Sintering aids that can be used in cermet formulations include, but are not limited to metals like Ni, Mo, Nb, and the like, and combinations thereof.

Additives to enhance the performance of the heat exchanger device also can be mixed with the shell composition. Nano additives can be used to increase the thermal conductivity of the heat exchanger device. Suitable nano additives include carbon black, carbon additive, silicon carbide, carbon nanotubes (commercially available from Carbon Nanotechnologies, Inc.) and nano fibers (commercially available from Applied Sciences, Inc. of Ohio). Preferably, the nano additives are mixed with the shell compositions in amounts of between about two to about five weight percent based on the weight of the composition.

The core is formed from a compound that can be removed in a finishing step during fabrication of the heat exchanger bodies, leaving hollowed out shells that are the channels of the heat exchanger. For example, the core can be a solvent-soluble compound that is removed by flushing the heat exchanger body with the solvent. As another example, the core can be removed by heating such as in a binder burnout process. Compositions for forming the core can include water-soluble organic binders, such as PMMA (polymethyl methacrylate), EVA (ethyl vinyl acrylate), EEA (polyethylene ethacrylate), PEOx (poly-2-ethyl-2-oxazoline), PEG (polyethylene glycol), polystyrene, derivatives and copolymers of such polymers, microcellulose, and the like, and combinations thereof. In one aspect of the invention, a water-soluble composition, Aquaport™, commercially available from Advanced Ceramics Research of Tucson, Ariz., is used as the core material.

The core composition can include a filler component to enhance the compressive strength of the filament to avoid any undesired decreases in the compressive strength that could result in distortion of the geometry of the heat exchanger body. Fillers include talc and synthetic fibers, such as polyester or polypropylene fibers. Any suitable type and form of fiber that is compatible with the filament components can be used.

Generally, as illustrated in FIG. 4, in a non-continuous process of preparing filaments, starting materials for a core composition 20 and shell composition 22 are separately blended, and the core 24 and shell 26 are formed. The core and shell are combined into a feed rod 28, which is extruded 30 one or more times to provide a ceramic filament 32 of a predetermined length. Multiple filaments can be bundled and again extruded one or more times 34 to produce a finished filament 36 having desired core diameters. The individual or bundled filaments can be arranged in a predetermined manner to fabricate a structure having a desired configuration 38. In other embodiments, the filaments can be prepared using any continuous process known to those of skill in the art and mechanically arranged to provide a multi-layer heat exchanger body.

Commercially available powders can be used to prepare shell composition for use in the invention. Milling stations such as commercially available from Boston Gear, Boston, Mass. may be used as needed to ball mill the powder to obtain the desired size distribution. The powder can be ball milled with a solvent such as ethanol. The powder/solvent blend is ball milled with milling media such as silicon nitride ($Si_3N_4$) or zirconium oxide ($ZrO_2$) to provide a ball-mill slurry. Sintering aids can be milled together with the ball mill slurry as desired. The powders are milled for a time effective for providing desired particle sizes and distribution. Typical milling times are between about 24 to about 120 hours, depending on the starting material.

Upon completion of the milling operation, the ball mill slurry is collected from the milling station and the powder/solvent mixture is separated from the milling media. The solvent is separated from the powder, such as with a Buchi Rotavapor separator commercially available from Brinkman Instruments Inc. of Westbury, N.Y., where solvent is evaporated from the ball-milled slurry. The powder is dried.

The powders of the shell composition are blended with thermoplastic melt-spinnable polymer binders, as well as one or more processing aids such as plasticizers, as desired, to form a smooth, uniformly suspended composite blend also referred to as a "dope". A high shear mixer commercially available from C. W. Brabender of South Hackensack, N.J. or from Thermo Haake of Paramus, N.J., can be used. The composite blends are compounded at about 150° C. and a viscosity-modifying additive blended with the composite blend until a viscosity is obtained to provide rheology suitable for a molten fiber extrusion process.

A "green" composite feed rod 28 is formed from the composite blends. A composite feed rod includes a central portion of the core material surrounded by a generally annular portion of the shell material. In a non-continuous process, the composite blends are warm-pressed. A hydraulic vertical press with one or more heated cylindrical dies can be used to press the cores 24. A heated uniaxial platen press, such as commercially available from Carver Inc., of Wabash, Ind., can be used to press the shells 26 for the composite feed rods. The volume ratio of the core and shell of a composite feed rod can be varied to any desired ratio, such as by using different sets of machine tooled core and shell dies, to achieve the desired diameter of the core material.

A pressed feed rod 28 is extruded 30. One extrusion process includes a computer numerically controlled (CNC) ball-screw extruder, including a ball screw from Thomson Saginaw of Saginaw, Mich., connected to a CNC directed current (DC) servomotor from Compumotor, Rohnert Park, Calif. The ball screw is connected to a brass metal rod that is used to pressurize and extrude the contents of the heated cylindrical die. The assembly is mounted and held vertically in a metal framework. Composite feed rods are extruded through a spinneret to produce a green fiber filament 32. This process also is referred to as "single filament co-extrusion" (SFCX). If desired, a plurality of filaments may be bundled together and extruded one or more times.

Preferably, the viscosity of the core material is approximately equivalent to the viscosity of the shell material. Use of core and shell materials with approximately equivalent viscosities provides improved flow stability and control which helps to maintain the original geometry of the feed rod.

Although the invention is described with reference to generally cylindrical-shaped filaments that are bundled together, other configurations are contemplated, as will be appreciated by those skilled in the art. For example, filaments having square, rectangular or triangular cross-sections are obtained by varying the shape of the extrusion die accordingly. Additionally, the shape of the die used in the laminating step also may be modified accordingly as desired. Thus, different shapes and configurations of filaments may be obtained.

Numerous modifications and adjustments to the process for preparing filaments may be made to allow for variations in the particular compositions used to prepare the filaments. For example, viscosities may be adjusted, the diameter of the extrusion die may be changed, or the relative volumes of the core and shell may be changed. Other methods for extruding and/or otherwise forming the filaments known to those of skill in the art also may be utilized. For example, the filaments may be produced using a continuous co-extrusion process, such as disclosed in U.S. patent application Ser. No. 10/005,683, incorporated herein by reference.

The extruded, composite green filament generally is flexible and can be formed into heat exchanger bodies in accordance with the invention. The filament can be formed into the structures either manually or mechanically. Mechanical methods for extruding and arranging the filament include rapid prototyping processes, such as the extrusion freeform fabrication process disclosed in co-pending U.S. patent application Ser. No. 10/005,656, incorporated herein by reference. With rapid prototyping processes, it is possible to form structures having more uniform thickness and channel dimensions.

The extruded filament is deposited in a controlled manner onto a working surface. If desired, the extruded filament is formed into a heat exchanger body of any desired geometry directly from CAD designs. It is thus desirable that the extrusion system has hardware capable of processing CAD drawings so that the heat exchanger bodies can be built by a rapid prototyping process. One or more extruded filaments are used to fabricate heat exchanger bodies in a layer-wise fashion by the sequential stacking of discrete extruded raw material layers upon each other until the final heat exchanger body is formed. If the heat exchanger device includes external cooling elements, the elements also are formed in a layer-wise fashion, so that the elements do not have to be separately laminated to the heat exchanger device. A separate extrusion nozzle for the single material can be operated concurrently with the extrusion nozzle for the two-component filaments. Each layer that is formed has a geometry corresponding to a horizontal cross section of the heat exchanger body. In this manner, heat exchanger bodies are manufactured with complex and varying orientations of microstructure.

Final processing of the heat exchanger bodies is completed as desired to finish the bodies. For example, a binder burnout furnace, such as commercially available from Lindberg, Watertown, Wis. is used to remove polymer binder from the heat exchanger body. Sintering processes, including hot pressing, hot isostatic pressing or pressureless sintering, provide final consolidation and densification of the shell composition. A typical induction hot-press such as commercially available from Vacuum Industries, Somerville, Mass. is capable of a maximum temperature of 2400° C. and a maximum load of 100 tons and can be operated in several different environments including vacuum, argon, and nitrogen atmospheres. Pressureless sintering methods, such as disclosed in U.S. patent application Ser. No. 10/005,241, incorporated herein by reference, also can be used. For example, with monolithic SiC, the structure is sintered at a temperature of up to about 1750° C. in a nitrogen atmosphere.

Removal of the core material can be completed using any suitable method either prior to or during final processing depending on the particular core material. Suitable methods will provide for essentially complete removal of the core material while maintaining the integrity of the shell material. For example, the heat exchanger body can be flushed with an appropriate solvent, such as water, to wash away a solvent soluble core material. In other aspects, the core material may be essentially burned from the heat exchanger body.

In one embodiment, the outer surfaces of the finished heat exchanger device are further processed to enhance the thermal conductivity of the device. Any method of chemical vapor deposition ("CVD") is used to provide a thin layer of material on the outer surfaces. Preferably, the layer does not substantially increase the thickness of the heat exchanger device. For example, the thickness of the layer is between about 10 to about 15 microns. The deposited material is the same as or compatible with the material used to form the heat exchanger device. Suitable materials include SiC, carbon and the like. Although not wishing to be bound by any theories, it is believed that the deposited layer of material enhances the thermal conductivity of the device because a more pure form of the material is deposited, e.g., no additives are mixed with the material and the material is not subject to processing defects resulting from extrusion and other processing steps.

In another embodiment, the outer surfaces of the heat exchanger device are subject to any suitable metallization process known to those of skill in the art to provide a metallic layer. With such processes, a thin metallic layer is deposited onto a substrate and bonded to the substrate by melting the metallic layer or otherwise. Suitable metals include nickel, copper and the like. In electronic applications, the addition of the metal layer allows the heat exchanger device to function with electronic circuitry, which can be deposited on the surface of the heat exchanger device.

Numerous modifications and variations may be made in the techniques and structures described and illustrated herein without departing from the spirit and scope of the present invention. Thus, modifications and variations in the practice of the invention will be apparent to those skilled in the art upon consideration of the foregoing detailed description of the invention. Although preferred embodiments have been described above and illustrated in the accompanying drawings, there is no intent to limit the scope of the invention to these or other particular embodiments. Consequently, any such modifications and variations are intended to be included within the scope of the following claims.

EXAMPLES

The following examples are intended to illustrate the invention and not to limit or otherwise restrict the invention.

Example 1

This example illustrates an analytical model that can be applied to characterize and optimize a heat exchanger device. A closed-form analytical solution for the overall thermal resistance of single and multi-layered channels is evaluated. Optimization work is presented to obtain the optimum number of layers to maximize thermal performance for a given pumping power. The analytical solution allows for an efficient parametric study to determine the optimum design parameters. The constants and variables used in the model are defined in Table I.

TABLE I

| SYMBOL | DESCRIPTION |
|---|---|
| a | channel height, (m) |
| A | area, (m$^2$) |
| b | channel width, (m) |
| $c_p$ | specific heat of water, (J/kg · C.) |
| $D_h$ | hydraulic diameter, (m) |
| f | friction factor |
| h | base thickness, (m) |
| $\bar{h}$ | heat transfer coefficient, (W/m$^2$ · C.) |
| H | sample thickness, (m) |
| k | thermal conductivity (W/m · C.) |
| L | sample length, (m) |
| ṁ | mass flow rate, (kg/s) |
| n | number of channels |
| Nu | Nusselt number |
| Δp | pressure, (Pa) |
| P | pumping power, (W) |
| $P_w$ | wetted perimeter, (m) |
| Pr | Prandtl number |
| q | heat flow, (W) |
| $R_{base}$ | base conduction thermal resistance, (C./W) |
| $R_{base,conv}$ | base convective thermal resistance, (C./W) |
| $R_{eq,n}$ | overall thermal resistance for n layers, (C./W) |
| $R_{fin,conv}$ | fin convective thermal resistance, (C./W) |
| $R_{fluid}$ | fluid advection thermal resistance, (C./W) |
| Re | Reynolds number |
| T | temperature, (C.) |
| $u_m$ | mean channel velocity, (m/s) |
| $\dot{V}$ | volumetric flow rate, (ml/min) |
| w | channel pitch, (m) |
| W | sample width, (m) |
| x | span-wise coordinate |
| x$^+$ | non-dimensional length (eq. 8) |
| y | normal coordinate |
| z | axial coordinate |
| GREEK | |
| Δ | delta, change in property |
| μ | dynamic viscosity (N · s/m$^2$) |
| ρ | fluid density, (kg/m$^3$) |
| θ | non-dimensional thermal resistance |
| SUBSCRIPTS | |
| c | cross-sectional flow |
| f | fluid |
| in | inlet |
| out | outlet |
| s | solid matrix or surface |
| y | y direction, normal to flow |

A heat exchanger system using forced convective flow is analyzed. The overall heat sink has dimensions of height H, length L and width W. The bottom surface (y=0) and top surface (y=H) are subject to a symmetrical constant heat flux, and these surfaces are assumed to be isothermal.

Each channel is modeled as a square duct with a hydraulic diameter specified as $D_h$, length L, base thickness h, and channel pitch, w. A single column is considered as the domain with the assumption that there are no thermal gradients in the x-direction. Single-phase laminar flow through the channels is considered with a steady velocity of magnitude, $u_m$, through each channel. Thermally developing heat flow is considered in the analysis. The thermal physical properties of fluid such as thermal conductivity, density and viscosity are constant and defined at the inlet temperature.

As the aspect ratio of the channels, a/b, increase, the temperature difference between the fins and the base increases. In the present analysis of square channels, the fin spacing becomes large and therefore the channel walls can be assumed to be isothermal and of equal temperature to the base temperature. The effects of the top surface of the channel are also included.

Hydrodynamic Consideration

Within in each channel, pressure drop is given in terms of the dimensionless friction factor:

$$f = \frac{2\Delta P}{\rho u_m^2} \cdot \frac{D_h}{L}$$

where $D_h$ represents the hydraulic diameter.

$$D_h = \frac{4A_c}{P_w}$$

An approximation for the hydrodynamic entry-length is:

$$x_{fd,h} \approx 0.05 Re D_h$$

where the Reynolds number, Re, is expressed in terms of the mean velocity and hydraulic diameter.

This entry-length is usually compared with the length of the sample to determine if the developing entry region is significant compared to the overall channel length. For a square channel, the friction factor for fully developed flow is given by:

$$f = \frac{57}{Re}$$

Thermal Characterization

For water, Pr=7, the thermal entry-length cannot be ignored, and is approximately given by the expression by:

$$x_{fd,t} \approx 0.05 Re Pr D_h$$

A correlation for local Nusselt number in thermally developing laminar flow in a square duct with symmetrical heating is given as:

For x$^+$<0.2, Nu=3.076*exp((ln(x+)−0.1289)$^2$/21.77).
For x+>0.2, Nu asymptotes to Nu=2.98, where x$^+$ is the non-dimensional length defined as:

$$x^+ = \frac{2(L/D_h)}{Re\,Pr}$$

The heat transfer coefficient, $\bar{h}$, can be obtained from the Nusselt number and written in the form:

$$\bar{h} = \frac{Nu\,k_f}{D_h}$$

Thermal Resistance Network

A one-dimensional thermal resistance network is used to represent the SiC heat sinks. Although the approach is approximate, accurate results may be obtained without the need for complex simulation tools.

One Layer Case

Figure 5:
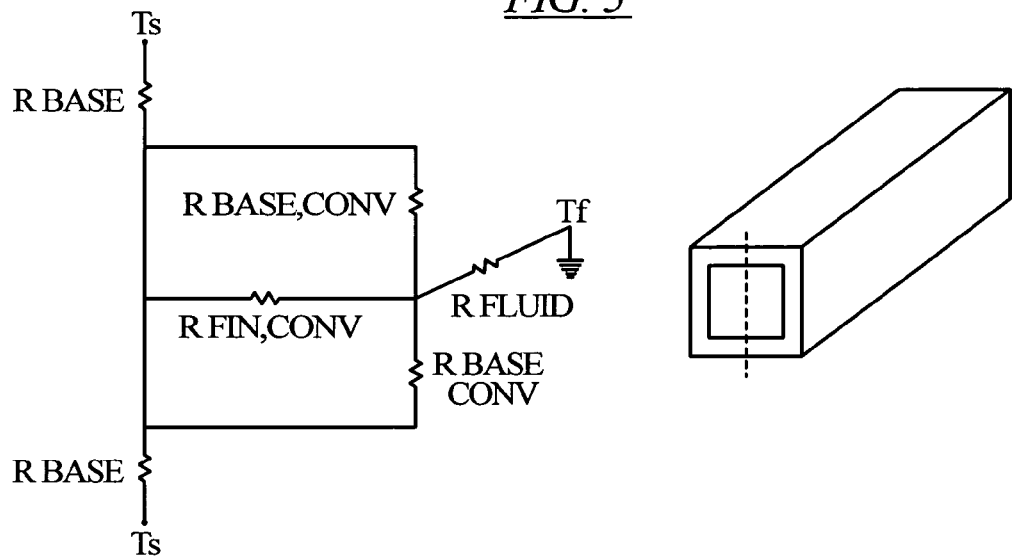
FIG. 5 illustrates a thermal resistance network for modeling a single-layer heat exchanger in accordance with the present invention.

The thermal resistance network for the single layer with heat loads from top and bottom is shown in FIG. 5. The equivalent resistance, $R_{eq}$, is defined from the exit surface temperature node, $T_s$, to the fluid inlet temperature node, $T_{f,in}$.

$$R = \frac{T_s - T_{f,in}}{q}$$

The base thickness resistance, $R_{base}$, is defined as the conduction resistance from the bottom surface to the base of the solid-fluid interface:

$$R_{base} = \frac{h}{k_s\left(\frac{w}{2} + \frac{b}{2}\right)L}$$

The conductive resistance though the fin is defined as:

$$R_{fin} = \frac{a}{k_s \frac{w}{2} L}$$

Assuming isothermal condition at the base of the fluid, the convection resistance from the base temperature to the fluid exit temperature node is:

$$R_{base,conv} = \frac{1}{h \frac{b}{2} L}$$

The convective resistance from the fin to the fluid outlet node is defined as:

$$R_{fin,conv} = \frac{1}{haL}$$

The advection resistance from the fluid outlet temperature to the fluid inlet temperature is:

$$R_{fluid} = \frac{1}{\dot{m} c_p}$$

The equivalent resistance for the one layer case, $R_{eq,1}$, is solved using a combination of series and parallel resistances:

$$R_{eq,1} = \frac{R_{base}}{2} + \left[\frac{R_{base,conv}}{2} \| R_{fin,conv}\right] + R_{fluid}$$

where the parallel symbol "∥" is defined as:

$$x \| y = \frac{x \cdot y}{x + y}$$

Multi-Layer Case

Figure 6:
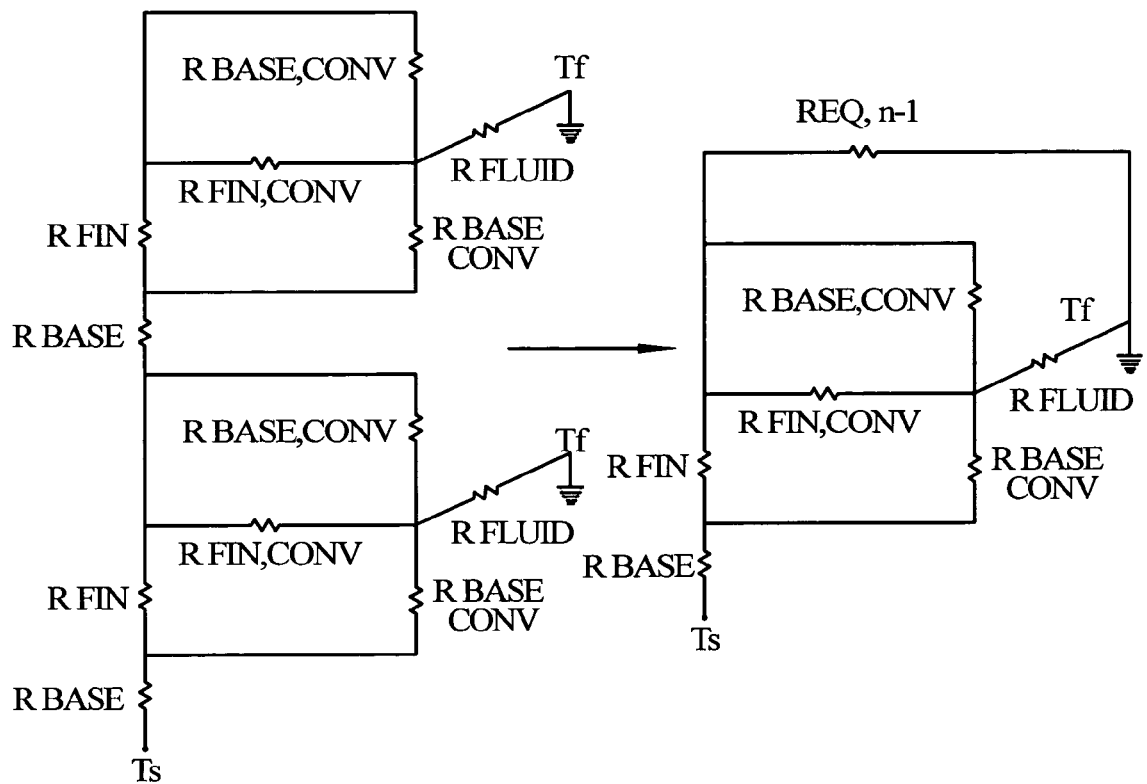
FIG. 6 illustrates a thermal resistance network for modeling a multi-layer heat exchanger in accordance with the present invention.

The resistance network for the single layer structure is repeated to obtain the network for the multi-layer structure shown in FIG. 6, where n represents the number of layers. The base case for the multi-layer analysis represents a two-layer case with two-sided heating or a one-layer case with one-sided heating.

$$R_{eq,2} = R_{base} + [R_{base,conv} \| (R_{fin} + (R_{fin,conv} \| R_{base,conv}))] + R_{fluid}$$

Figure 7:
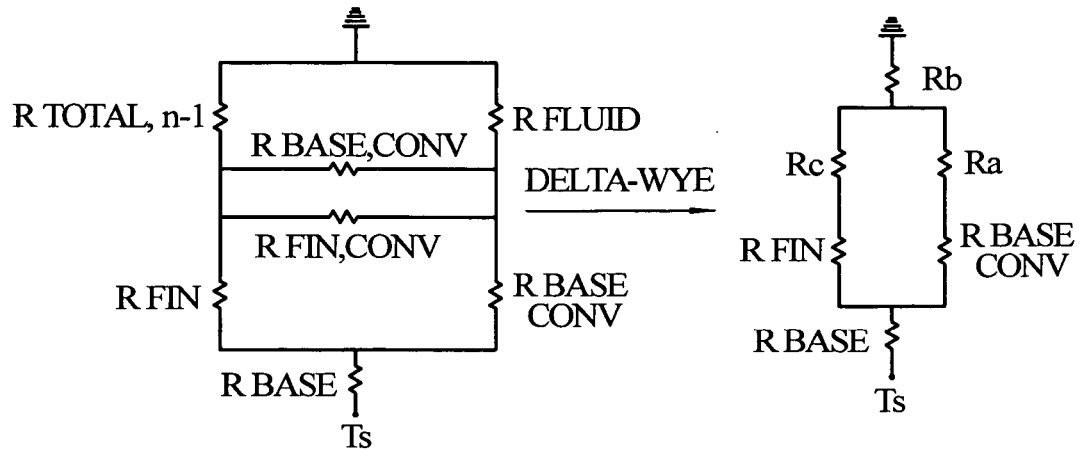
FIG. 7 illustrates a second thermal resistance network for modeling a multi-layer heat exchanger in accordance with the present invention.

The resistance network in FIG. 6 cannot be solved using series and parallel resistances. The multi-layer structure can be re-written as a Delta load structure as in FIG. 7 and transformed into a Wye load structure. The corresponding resistances for the Wye load are shown below.

$$R_a = \frac{R_{fluid}(R_{fin,conv} \| R_{base,conv})}{R_{eq,n-1} + (R_{fin,conv} \| R_{base,conv}) + R_{fluid}}$$

$$R_b = \frac{R_{eq,n-1} R_{fluid}}{R_{eq,n-1} + (R_{fin,conv} \| R_{base,conv}) + R_{fluid}}$$

$$R_c = \frac{R_{eq,n-1}(R_{fin,conv} \| R_{base,conv})}{R_{eq,n-1} + (R_{fin,conv} \| R_{base,conv}) + R_{fluid}}$$

The equivalent resistance, $R_{eq,n}$, can now be solved for the multi-layer case using a combination of series and parallel resistances.

$$R_{eq,n} = R_b + [(R_c + R_{fin}) \| (R_a + R_{base,conv})] + R_{base}$$

Numerical Validation

Several assumptions are made in the one-dimensional analytical model. In order to validate this simple model, a numerical simulation is performed.

Figure 8:
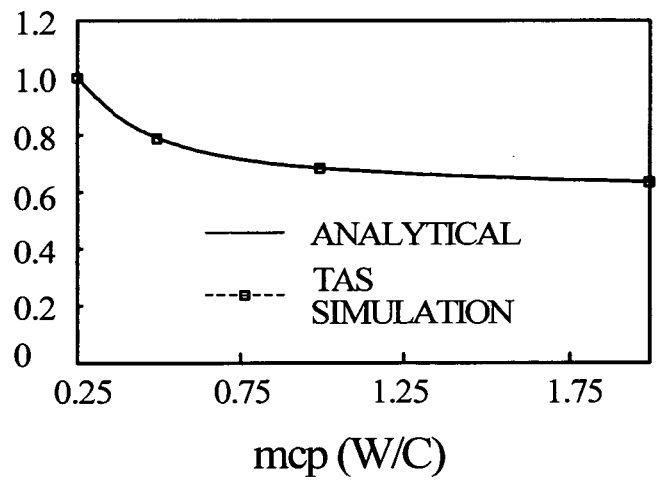
FIG. 8 is a graphical illustration of thermal resistance for a single-layer heat exchanger in accordance with the present invention.
Figure 9:
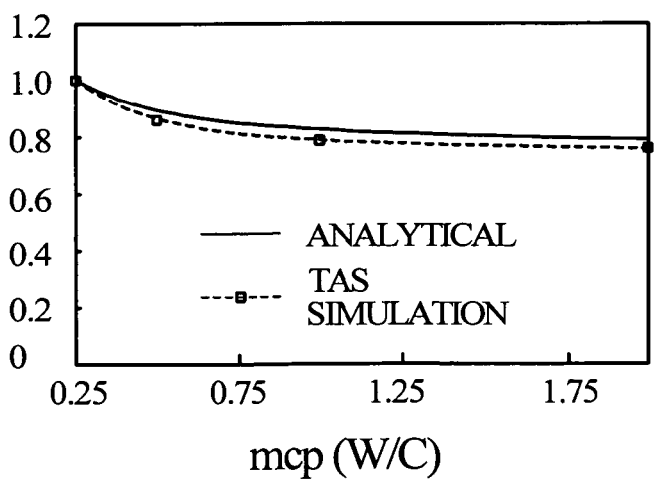
FIG. 9 is a graphical illustration of thermal resistance for a multi-layer heat exchanger in accordance with the present invention.

A one-layer validation model was compared using a commercial finite difference simulation tool and the analytical model. The thermal resistances for both cases are compared in FIG. 8 and show good agreement. To validate the multi-layer analytical model, a four-layer validation sample with two-sided heating was tested. FIG. 9 shows reasonable agreement.

The TAS simulation assumes symmetrical heating in the channels when specifying the heat transfer coefficient. This may or may not be a conservative assumption. Therefore, it may be necessary to conduct a full 3-D conjugate numerical simulation in order to validate the analytical model.

Results

Using the assumption of hydrodynamically, fully-developed flow and the measured pressure drop and volumetric flow rate, $\dot{V}$, the mean-averaged diameter can be calculated as:

$$D_h^4 = \frac{28.5\mu\dot{V}L}{6\cdot 10^7 \Delta pn}$$

The model shows that there is a reduction in the thermal resistance with an increase in the flow rate as expected. With all other parameters held constant, an increase in the flow rate will reduce the advection resistance, $R_{fluid}$, which will decrease the overall thermal resistance for both single and multi-layers.

With the increase in number of layers, there is a reduction of the flow rate in each channel, for fixed flow rate, and hence an increase in the convective and advective resistances in each individual channel. However, conduction into the upper channels enables exchange of heat into the upper channels, thereby increasing the effective surface area for convection. Clearly an optimum exists, when the increase in convective and advective resistances is balanced by the increase in heat exchange area, as shown in FIG. 10.

A metric commonly used in conjunction with thermal resistance is the pumping power. It is defined as the product of the pressure drop and overall volumetric flow rate.

$$P = \Delta p \dot{V}$$

Figure 10:
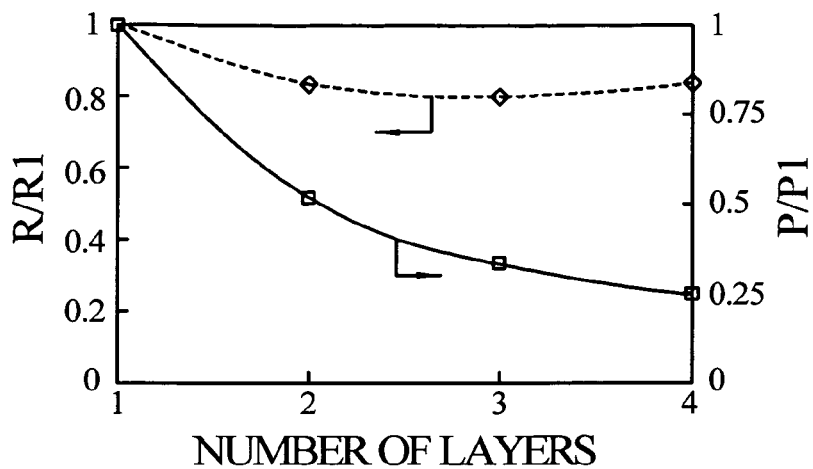
FIG. 10 is a graphical illustration of optimization conditions for a heat exchanger derived by an analytical model in accordance with the present invention.

From FIG. 10, there is a significant reduction in the pumping power with the increase in number of layers but with no penalty in the thermal resistance for a fixed overall flow rate. It should be noted that the optimum number of layers is dependent on the parameters specified. Both thermal resistance and pumping power are scaled with the one layer case.

For a fixed flow rates, multi-layer heat exchangers up to four layers show a thermal resistance about 20% lower than single row heat exchangers. For a fixed hole geometry and a fixed flow rate, the optimum number of rows in a multi-layer heat exchanger is set by a trade-off between the increase in surface area available for convection with increasing rows, and the decrease in the flow rate and heat transfer coefficient in each channel. An optimum number of rows of three is apparent for the channel dimensions considered herein. For fixed flow rate, there is large drop in pumping power with increasing number of rows, with little penalty on the thermal performance. Thus, multi-layered heat exchangers have both lower thermal resistance and lower pumping power, compared to single layer heat exchangers.

Example 2

Figure 11:
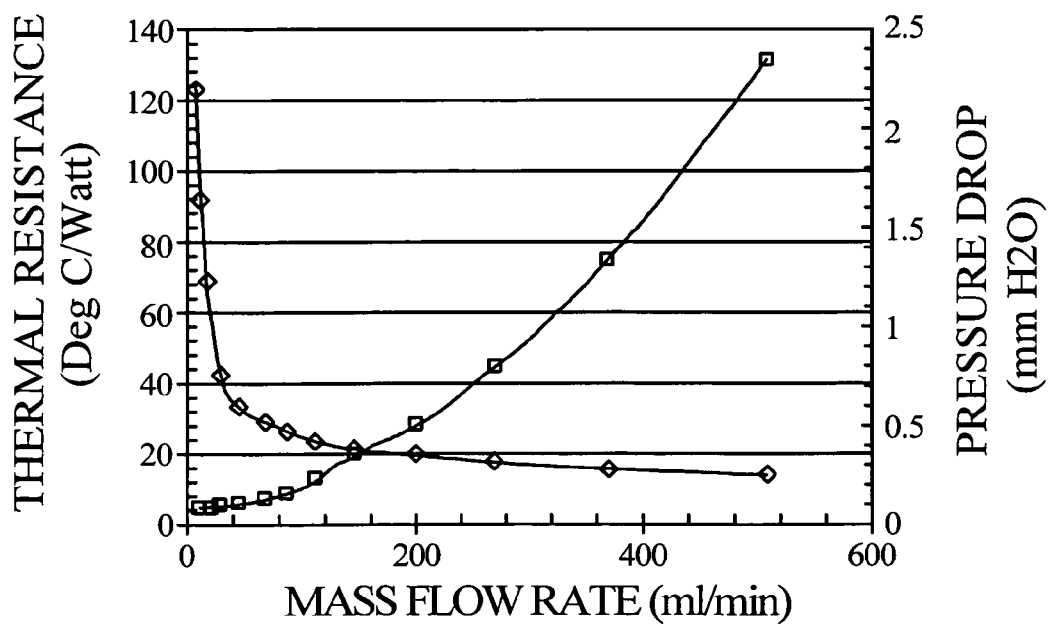
FIG. 11 is a graphical illustration of thermal resistance and pressure drop for a heat exchanger in accordance with the present invention.
Figure 12:
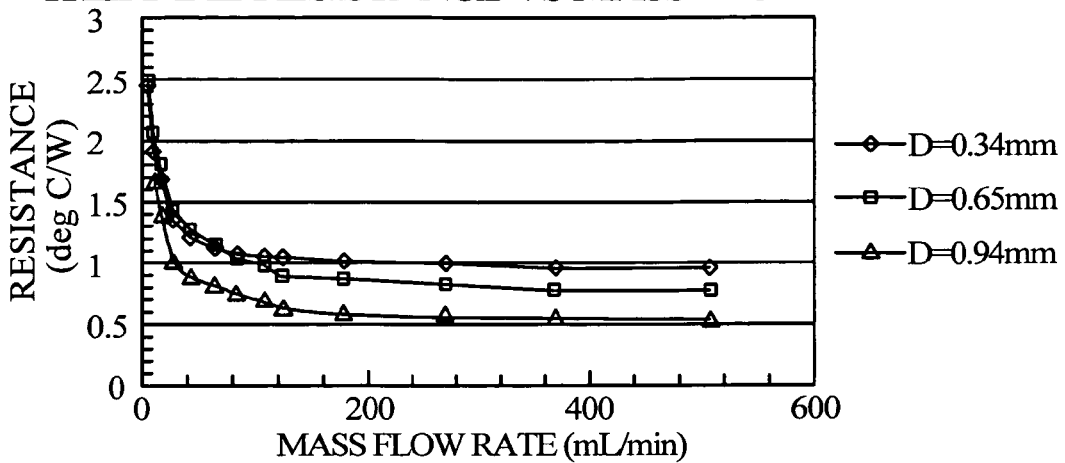
FIG. 12 is a graphical illustration of thermal resistance for various channel diameters for a heat exchanger in accordance with the present invention.
Figure 13:
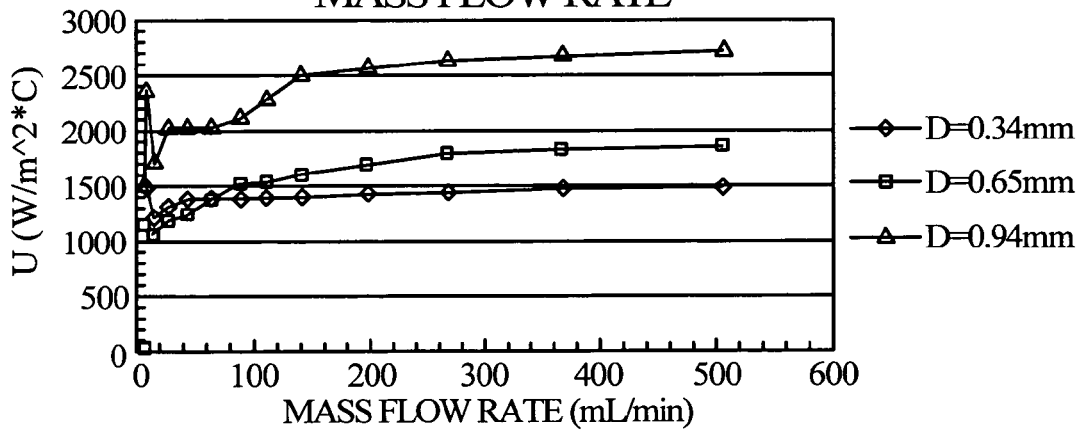
FIG. 13 is a graphical illustration of heat transfer coefficient for various channel diameters for a heat exchanger in accordance with the present invention.
Figure 14:
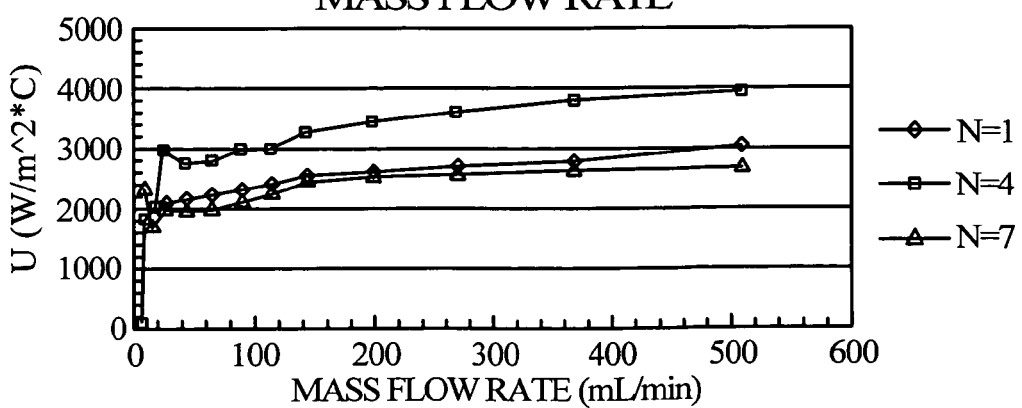
FIG. 14 is a graphical illustration of heat transfer coefficient for various numbers of rows in a heat exchanger in accordance with the present invention.

A heat exchanger having SiC channels was fabricated. The overall thermal resistance of the heat exchanger decreased and the pressure drop increased with increased mass flow rate of the coolant, as illustrated in FIG. 11. For fixed heat sink dimensions, channel diameter and porosity varied, as illustrated in FIGS. 12 and 13. An optimum number of rows of channels was determined for the heat exchanger, as illustrated in FIG. 14.

What is claimed is:

1. A method comprising:
    (a) simultaneously co-extruding a first composition and a second composition to form a plurality of two-component filaments, each filament including the first composition encased in the second composition;
    (b) depositing the filaments onto a working surface in a plurality of layers, in a predetermined orientation, using a computer-controlled deposition mechanism, to provide a green body;
    (c) subjecting the green body to conditions effective for removing the first composition from the filaments and for sintering the second composition to provide a heat exchanger including a plurality of channels having walls made of the sintered second composition for containing coolant flow, the channels having inner diameters of no more than about 2000 microns.

2. The method of claim 1 wherein the second composition includes a material effective for enhancing the thermal conductivity of the heat exchanger.

3. The method of claim 2 wherein the material is a nano additive selected from the group consisting of carbon black, carbon, silicon carbide, carbon nanotubes and nano fibers.

4. The method of claim 3 wherein the nano additive is present in an amount of between about two to about five weight percent based on the weight of the second composition.

5. The method of claim 1 wherein the first composition is a composition that is soluble in at least one solvent and wherein the first composition is removed from the green body by contacting the green body with the solvent.

6. The method of claim 5 wherein the solvent is water.

7. The method of claim 1 wherein the second composition is selected from the group consisting of ceramic oxides, ceramic carbides, ceramic nitrides, ceramic borides, ceramic silicides, metals, and intermetallics, and combinations thereof.

8. The method of claim 7 wherein the second composition is silicon carbide.

9. The method of claim 1 wherein the method includes depositing a thin layer of a material on an outer surface of the heat exchanger to enhance the thermal conductivity of the heat exchanger.

10. The method of claim 9 wherein the layer of material is deposited by a chemical vapor deposition process.

11. The method of claim 1 wherein the channels have inner diameters of between about 50 microns to about 2000 microns.

12. The method of claim 11 wherein the inner diameters of the channels are between about 50 to about 100 microns.

13. The method of claim 1 wherein the first composition is a thermally degradable composition and wherein the first composition is removed from the green body by heating to a temperature and for a time effective for removing the first composition.

14. The method of claim 1 wherein the method includes depositing a metallic layer onto a surface of the heat exchanger by a metallization process.

15. The method of claim 1 wherein the method includes integrally forming one or more external protrusions on the green body.

16. The method of claim 1 wherein the channels are arranged in the same direction.

17. The method of claim 1 wherein the filaments are arranged in two or more layers and at least two adjacent layers are arranged with the filaments positioned at 90° to one another to provide a heat exchanger having multi-directional channels.

18. The method of claim 1 wherein the channels are curved.

19. The method of claim 1, further comprising:
(d) connecting a first manifold to a first wall of the heat exchanger; and
(e) connecting a second manifold to a second wall of the heat exchanger.

20. The method of claim 1 wherein each layer of the green body has a geometry corresponding to a horizontal cross section of the heat exchanger.

21. A method comprising:
(a) simultaneously co-extruding a first composition and a second composition to form a plurality of two-component filaments, each filament including the first composition encased in the second composition;
(b) arranging the filaments on a working surface to form a plurality of layers, in a predetermined orientation, to provide a green body;
(c) subjecting the green body to conditions effective for removing the first composition from the filaments and for sintering the second composition to provide a heat exchanger including a plurality of channels having walls made of the sintered second composition for containing coolant flow, the channels having inner diameters of no more than about 2000 microns, wherein each layer formed of the deposited filaments has a geometry corresponding to a horizontal cross section of the heat exchanger.

22. The method of claim 21 wherein the filaments are arranged by depositing the filaments onto the working surface using a computer-controlled deposition mechanism.

23. The method of claim 22 wherein the computer-controlled deposition mechanism deposits the filaments in the predetermined orientation based on a CAD drawing of the green body.

24. A method comprising:
(a) forming a feed rod from a first composition and a second composition, the feed rod including the first composition encased in the second composition;
(b) extruding the feed rod through a deposition nozzle onto a working surface in a plurality of layers, in a predetermined orientation, by mechanically manipulating at least one of the deposition nozzle and the working surface, to provide a green body formed of a plurality of two-component filaments, each filament including the first composition encased in the second composition;
(c) subjecting the green body to conditions effective for removing the first composition from the filaments and for sintering the second composition to provide a heat exchanger including a plurality of channels having walls made of the sintered second composition for containing coolant flow, the channels having inner diameters of no more than about 2000 microns.

25. The method of claim 24 wherein each layer of the green body has a geometry corresponding to a horizontal cross section of the heat exchanger.

* * * * *